United States Patent [19]
Fuderer et al.

[11] Patent Number: 4,998,064
[45] Date of Patent: Mar. 5, 1991

[54] METHOD OF AND DEVICE FOR DETERMINING A SPIN RESONANCE DISTRIBUTION

[75] Inventors: Miha Fuderer; Jacob A. den Boer, both of Eindhoven, Netherlands; Karsten Ottenberg, Hamburg, Fed. Rep. of Germany

[73] Assignee: U.S. Philips Corporation, New York, N.Y.

[21] Appl. No.: 364,354

[22] Filed: Jun. 9, 1989

[30] Foreign Application Priority Data

Jun. 23, 1988 [NL] Netherlands ................. 8801594

[51] Int. Cl.⁵ .......................................... G01R 33/20
[52] U.S. Cl. ................................. 324/309; 324/307
[58] Field of Search ............... 324/300, 307, 309, 318, 324/319, 322, 312, 313, 308

[56] References Cited

U.S. PATENT DOCUMENTS

| | | | |
|---|---|---|---|
| 4,739,266 | 4/1988 | Kanz | 324/307 |
| 4,818,941 | 4/1989 | McKinnon | 324/309 |
| 4,825,160 | 4/1989 | Kahn | 324/309 |

FOREIGN PATENT DOCUMENTS 2193320  2/1988  United Kingdom .

OTHER PUBLICATIONS

M. Fuderer: "Ringing artefact reduction by an efficient likelihood improvement method", Sixth Annual Meeting on the Society for Magnetic Resonance Imaging, Feb. 1988, & Magnetic Resonance Imaging, vol. 6, supplement 1, 1988, p. 19, abstract No. P37, Pergamon Press.

B. C. De Simone et al: "Maximum entropy method in phase-encoding NMR imaging", Magnetic Resonance in Medicine, vol. 4, 1987, pp. 78-82, Academic Press, Inc.

R. T. Constable et al: "Maximum entropy reconstruction in MRI" Medical Physics, vol. 14, No. 4, Jul/Aug. 1987, p. 710, abstract No. WP3-6.

*Primary Examiner*—Michael J. Tokar
*Attorney, Agent, or Firm*—Jack D. Slobod

[57] ABSTRACT

An MRI method is proposed where the profile distribution is automatically determined so that the information contents of the image are maximum, subject to the restriction that the total number of profiles used to obtain the image is predetermined. During the determination of the profile distribution, profiles will be selected which have a minium redundancy and a redundancy pattern $r(k_y)$ will be dynamically adapted as a function of the spatial frequency $k_y$. The redundancy of a profile increases as the number of times that a profile has been measured increases and is high when a signal-to-noise ratio associated with the profile is very small.

19 Claims, 5 Drawing Sheets

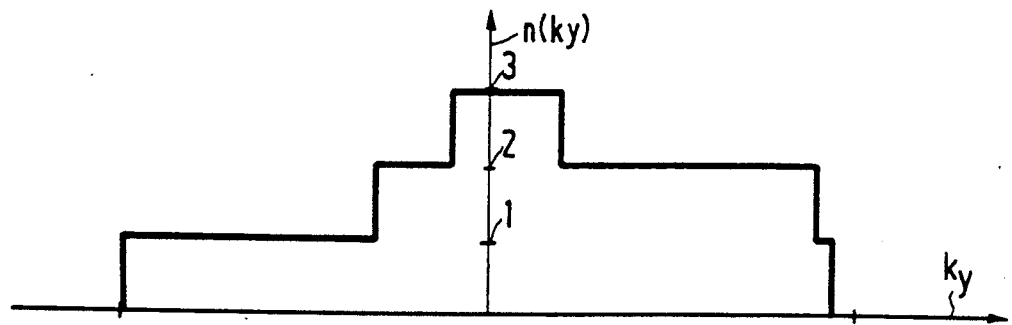
FIG. 3A
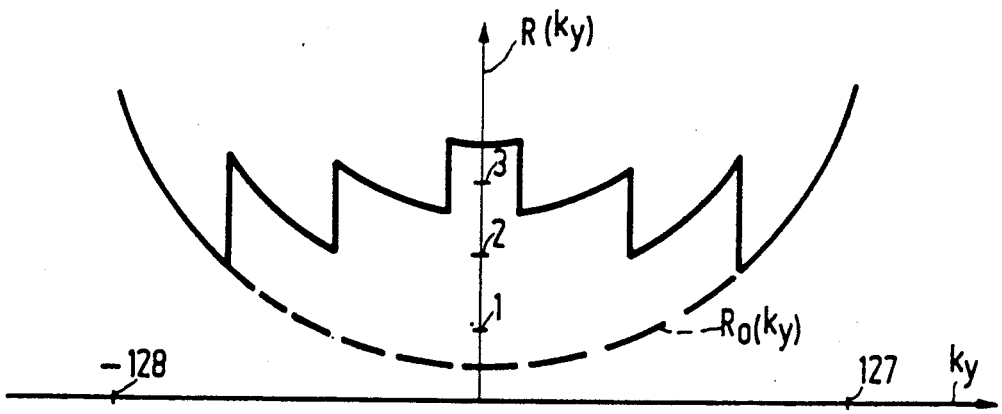
| $k_y$ | i | $R_0(k_y)$ | $R(k_y)$ |
|---|---|---|---|
| -128 | | | |
| | | | |
| | | | |
| | | | |
| 0 | | | |
| | | | |
| | | | |
| | | | |
| 127 | | | |
FIG. 3B
FIG. 3C

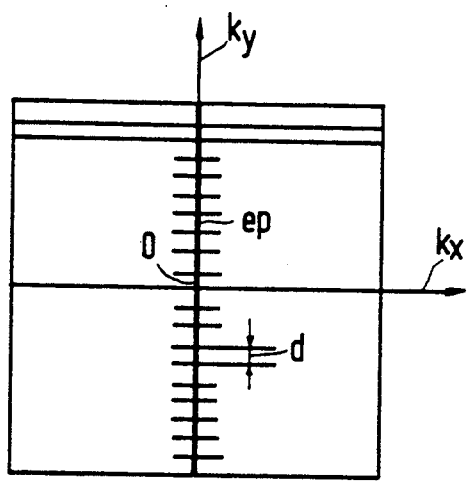 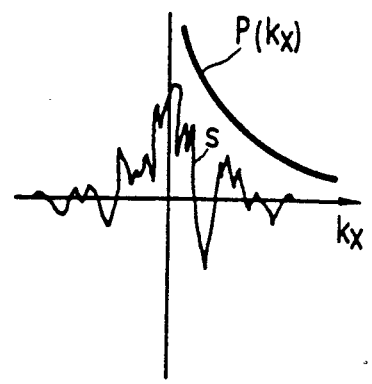
FIG. 4A          FIG. 4B
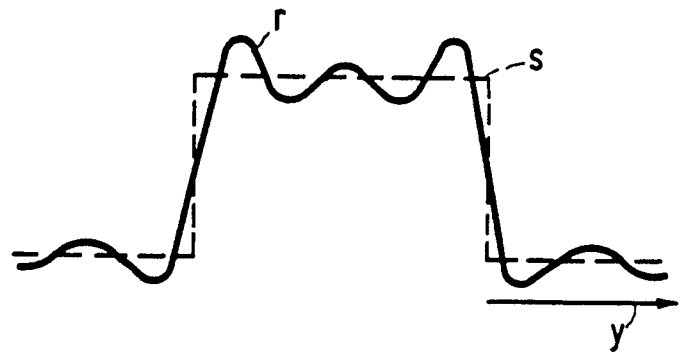
FIG. 5

METHOD OF AND DEVICE FOR DETERMINING A SPIN RESONANCE DISTRIBUTION

BACKGROUND OF THE INVENTION

1. Field of the Invention

The invention relates to a method of and device for determining a spin resonance distribution from unequal numbers of spin magnetic resonance signals acquired for different values of the time integral of a phase encoding gradient in which are generated in a region of an object containing atomic spins, such as nuclear spins, the spin magnetic resonance signals acquired for the same value of the time integral are averaged after signal acquisition and before determination of the spin resonance distribution. The invention is particularly suitable to nuclear spin magnetic resonance but can also be used for electron spin resonance.

2. Description of the Prior Art

Such a method is known from British Patent Application No. 2,193,320 corresponding to U.S. Pat. No. 4,740,749. This application describes rf pulse and gradient sequences for NMR (nuclear magnetic resonance) in which over a range of values of the time integral over a first magnetic field gradient used for phase encoding not all values are chosen an equal number of times for the acquisition of spin magnetic resonance signals in order to obtain an image therefrom. Hereinafter, one pulse and gradient sequence will be referred to as a profile. Prior to the determination of the image, for example by way of Fourier transformation, the spin resonance signals of equivalent profiles, i.e. profiles involving the same values for the first magnetic field gradient, are averaged. Because of the non-uniform profile distribution, this is referred to as "selective averaging". In said British Patent Application profile distributions are chosen which offer, selectively over a given range of spatial frequencies, an improvement of the signal-to-noise ratio in the image. Because not all profiles are measured equally frequently for the improvement of the signal-to-noise ratio in the image, unnecessary prolongation of the overall measuring time required for obtaining resonance signals for an image is avoided. A drawback of the method disclosed in said British Patent Application consists in that in advance a profile selection is made which is not based on an unambiguous criterion. For example, a distribution is proposed in which profiles with comparatively small values of the time integral (corresponding to comparatively low spatial frequencies) occur more frequently. Generally speaking, profile distributions are proposed in which profiles for a predetermined range of spatial frequencies are measured more often.

SUMMARY OF THE INVENTION

It is an object of the invention to provide a method of the kind set forth which does not have the described drawback.

To achieve this, a method in accordance with the invention is characterized in that there is determined a distribution of the values of the time integral which maximizes the information content of an image representing the spin resonance distribution, the number of times that the pulse and gradient sequence is applied being predetermined. Thus, an optimum comprise is achieved between the signal-to-noise ratio and the definition of the image. The profile distribution is determined by means of programmed means. Sampling values of the spin resonance signals associated with different values of the time integral over the first magnetic field gradient can be mapped on a two-dimensional space of spatial frequencies. By executing a two-dimensional Fourier transformation over the two-dimensional space, the spin resonance distribution is obtained for representation in a grey-tone image. Each point in the two-dimensional space may be considered to form an information source containing information concerning the image. When a set of different images is considered, a signal distribution within the set indicates, in each point in the two-dimensional space, the probability of occurrence of a given signal amplitude in the point. The amount of information received by measurement of a signal in the point is the entropy (uncertainty) of the signal distribution in the point. In order to obtain an estimate of such a distribution for each point, for example a set of images can be formed for different although similar objects. The distribution can be modelled by means of a two-dimensional Gaussian distribution in which the entropy is a function of the variance of the distribution in each point of the two-dimensional space. The variance determines how much image information is obtained in a point by measurement of a signal in the point. Furthermore, noise in a point is represented by a Gaussian distribution in the entropy of the point, so that the entropy of a noise-like information source is obtained. The execution of a variable number of measurements in a point becomes manifest in the entropy, so that the entropy $H(k)$ in a point $k$ in the two-dimensional space is:

$$H(k) = {}^2\!\log\{1 + n(k).vs(k)/vn\},$$

where $^2\log$ is a logarithmic operation with base 2, $n(k)$ is the number of measurements in the point $k$, $vs(k)$ is the variance in the signal in the point $k$, and $vn$ is the variance of the noise. The total information contents $I$ of the image then amount to $I = \Sigma H(k)$, being a sum of the entropy over the two-dimensional space, where $\Sigma$ is a summing sign. In accordance with the invention the information contents $I$ of the image are maximized, subject to the restriction that the total number of profiles for an image is predetermined, a distribution of the values of the time integral being determined on the basis of the maximization of the information contents. The total number of profiles can be determined from the total measuring time and the measuring time required for one profile. The value of the time integral of the first magnetic field gradient can be varied by varying its amplitude.

A version of a method in accordance with the invention is characterized in that the distribution is determined during the acquisition of the spin resonance signals by selecting from a redundancy table containing redundancy values for the values of the time integral, prior to the application of the pulse and gradient sequence, a value of the time integral which is associated with a minimum redundancy value, the redundancy values being a function of a signal-to-noise ratio associated with the value of the time integral, of the number of times that the value of the time integral has been selected, and of the number of times that an opposite value of the time integral has been selected, said redundancy values being adapted during the acquisition of the spin resonance signals. The maximization of the information content and the distribution of the profiles can be realized during the acquisition of the spin resonance signals by estimating, prior to the application of the rf electromagnetic pulse and gradient sequence, a value of the time integral which results in a maximum information increase in the image. When the function is suitably selected, this corresponds to an estimate of the minimum redundancy value for a profile. The redundancy for a profile is very high when there is substantially no signal (a small signal-to-noise ratio); such a profile does not lead to a substantial information increase in the image and the redundancy increases as the number of times that a profile has been measured is larger; measuring the profile again at the expense of other profiles does not result in the largest increase of the information content of the image. The progress in the assignment of profiles is recorded in the redundancy table.

A further version of a method in accordance with the invention is characterized in that the signal-to-noise ratio associated with a redundancy value is estimated from a signal-to-noise ratio associated with a neighbouring, already selected value of the time integral, the estimated signal-to-noise ratio being inserted in the redundancy table and the associated redundancy value being adapted. In practice the mean signal power of a profile becomes known only after the profile has been measured, so that estimation in advance of the redundancy value of the profile is not possible simply on the basis of the signal-to-noise ratio of the profile. Therefore, in practice the signal-to-noise ratio of a profile is estimated on the basis of the signal-to-noise ratio of a neighbouring profile which has already been measured, after which the profile with a minimum redundancy is looked up in the redundancy table.

Another version of a method in accordance with the invention is characterized in that prior to the acquisition of the spin resonance signals the distribution is determined from a predetermined redundancy table with redundancy values associated with values of the time integral of the first magnetic field gradient by applying in advance an additional pulse and gradient sequence in which the first magnetic field gradient is supplied during the signal acquisition in order to obtain an additional resonance signal wherefrom there is determined a signal distribution whereby a parameter of a model function of a distribution of a signal power is estimated, and by determining signal-to-noise ratios from a function of a mean noise power, the values of the time integral and the parameter determined, after which the distribution is determined by selecting the values of the time integral from minimum redundancy values, the redundancy values being a function of the signal-to-noise ratios, of the number of times that the value of the time integral has been selected, and of the number of the times that an opposite value of the time integral has been selected, said redundancy values being adapted during the determination of the profile distribution. Thus, it is achieved that the distribution which leads to a maximum information contents in the image is available prior to the acquisition of the spin resonance signals. This is useful notably when the device for executing the method is not capable of performing the assignment of profiles during the signals acquisition. The function of the signal-to-noise ratio in the redundancy values is then estimated on the basis of the additional pulse and gradient sequences in which the first field gradient takes over the rôle of the second field gradient during signal acquisition. In the spatial frequency space, sampling values are then obtained in the direction of the first field gradient. Said function is estimated from the signal decrease over the additional profile, it being necessary to have an estimate available for the signal power over the spatial frequency space. The estimate is made on the basis of a model of the signal power of the spatial frequency space. The mean noise power is determined in a pulse and gradient sequence in which the spins are not excited. The number of times that the values of the time integral will be assigned is determined on the basis of minimum redundancy in the same way as in the previously described version; the redundancy table is complied on the basis thereof.

A further version of a method in accordance with the invention is characterized in that during the acquisition of the spin resonance signals a succession of values of the time integral is selected from the distribution, such that effects of motion of the object are reduced. Because the distribution is available prior to the measurement of the resonance signals, the succession in which the profiles are measured can be chosen at random. As a result, for example, a succession of profiles can be chosen so that the effect of motion of the object is reduced. Such successions of profiles have already been described, for example in European Patent Application No. 0.218.838 and PCT Patent Application No. WO 87/00923 and are known in the form of acronyms such as ROPE, COPE and PEAR.

A further version of a method in accordance with the invention is characterized in that all associated rf pulse and gradient sequences over a sub-range of a range of values of the time integral are utilized to produce profiles to be measured. For instrumental reasons concerning the device for performing the method, it may be desirable to measure in any case central profiles in the spatial frequency space, for example 8 or 16 central profiles. When so-called partial matrix methods are used for reconstruction, it is necessary to measure also a number of negative profiles for low spatial frequencies, when profiles with positive values of the time integral have been measured.

A further version of a method in accordance with the invention is characterized in that over the range of values of the time integral there is made an estimate for resonance signals associated with non-measured values of the time integral so that an image is obtained which is a reasonable approximation of an image obtained by measurement of the non-measured resonance signals. For transitions from measured profiles to non-measured profiles a so-called Gibbs' phenomenon occurs, so that ringing artifacts are liable to occur in the image. In order to counteract such artifacts, all non-measured profiles are first equated to zero in a data array of spin resonance signals. Subsequently, the estimate is made, using a method as described in the article by M. Fuderer "Ringing artifact reduction by an efficient likelihood improvement method", Magnetic Resonance Imaging, vol. 6, suppl. I, p-37, 1988.

A further version of a method in accordance with the invention is characterized in that a step size between successive values of the time integral is adapted to a dimension of the object by estimating the dimension of the object from a resonance signal obtained by means of an electromagnetic pulse and gradient sequence in which the first magnetic field gradient is applied during the acquisition of the resonance signal. Thus, so-called back folding is avoided when the object is larger, in the direction of the first magnetic field gradient, than a field of view selected in the direction of the first magnetic field gradient.

BRIEF DESCRIPTION OF THE DRAWING

The invention will be described in detail hereinafter with reference to the drawing; therein FIG. 1 diagrammatically shows a device in accordance with the invention, FIG. 3A shows a profile distribution, FIG. 3B shows a redundancy table, FIG. 3C shows a redundancy pattern, FIG. 4A relates the spatial frequency plane to an additional resonance signal, FIG. 4B is a one-dimensional representation of a model function for a distribution of a signal power, FIG. 5 shows an abrupt signal transition giving rise to ringing artifacts in an image.

DETAILED DESCRIPTION OF THE PREFERRED EMBODIMENTS

Figure 1:
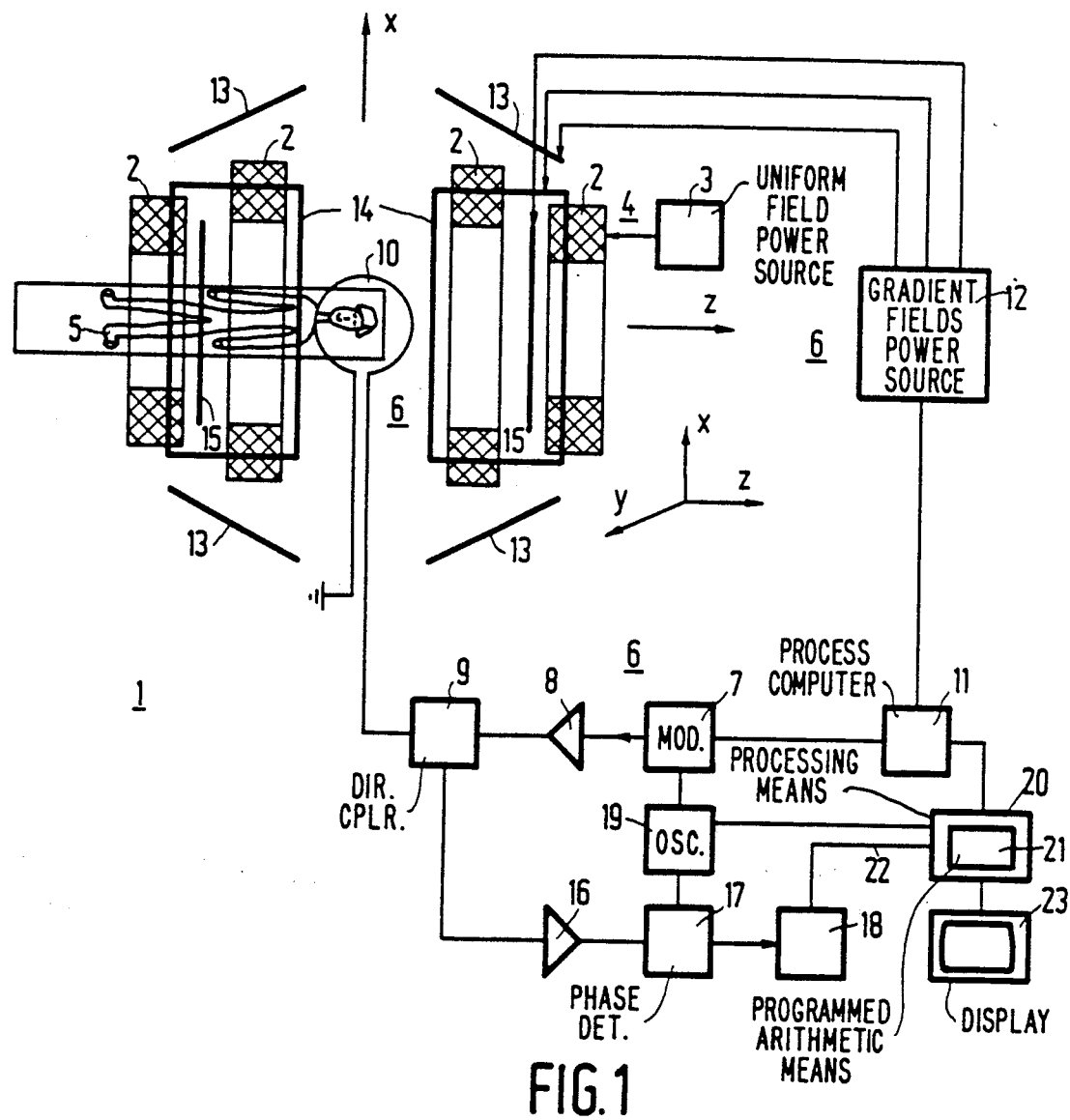

FIG. 1 diagrammatically shows a device 1 in accordance with the invention. The device 1 comprises magnet coils 2 and, in the case of resistance magnets or superconducting magnets, a d.c. power supply source 3. The magnet coils 2 and the d.c. power supply source 3 constitute means 4 for generating a uniform magnetic field $B_O$. When the magnet coils 2 are constructed as permanent magnets, the d.c. power supply source 3 is absent. Within the magnet coils 2 there can be arranged an object 5 which contains atomic spins, for example nuclear spins. During operation of the device 1 with the object 5 arranged within the magnet coils 2, a slight excess of nuclear spins (of nuclei having a magnetic moment) will be oriented in the direction of the field $B_O$ in the state of equilibrium. From a macroscopic point of view this is to be considered as a magnetization M, being an equilibrium magnetization. The device 1 also comprises means 6 for applying a pulse and gradient sequence in order to obtain spin resonance signals from a region of the object 5, which means comprise a modulator 7, an amplifier 8, a directional coupler 9, a transmitter/receiver coil 10 for transmitting rf electromagnetic pulses and for receiving magnetic resonance signals and a power source 12 which can be controlled by a process computer 11 and which serves to power individually controllable gradient magnet coils 13, 14 and 15. In the embodiment shown, the arrangement of the gradient coils 13, 14 and 15 in space is such that the field direction of respective magnetic field gradients $G_x$, $G_y$ and $G_z$ to be generated by means of the gradient magnet coils coincides with the direction of the magnetic field $B_O$, the gradient directions being mutually perpendicular; in FIG. 1 this is denoted by three mutually perpendicular axes x, y and z. The device 1 furthermore comprises means for receiving and detecting the spin resonance signals, i.e. the transmitter/receiver coil 10, an amplifier 16, a phase-sensitive detector 17, means for sampling the spin resonance signals, i.e. an A/D converter 18. The modulator 7 and the phase sensitive detector 17 are coupled to an oscillator 19 for generating a carrier signal. The modulator 7 is controlled by the process computer 11 which is coupled to processing means 20 which comprise programmed arithmetic means 21. In the case of quadrature detection, there is also provided a further A/D converter (not shown herein). Sampling values 22 can be applied to the processing means 20. The programmed arithmetic means comprise Fourier transformation means for reconstructing an image from sampled magnetic resonance signals. The device 1 furthermore comprises display means 23, inter alia for displaying the image. The transmitter/receiver coil can alternatively be constructed as a separate transmitter coil and a separate receiver coil; the transmitter coil and the receiver coil should then be decoupled from one another. Alternatively, for example the receiver coil may be constructed as a so-called surface coil. For a more detailed description of an NMR device, reference is made to the handbook "Practical NMR Imaging" by M. A. Foster and J. M. S. Hutchinson, pp. 1–48, 1987, IRL Press Ltd.

Figure 2A:
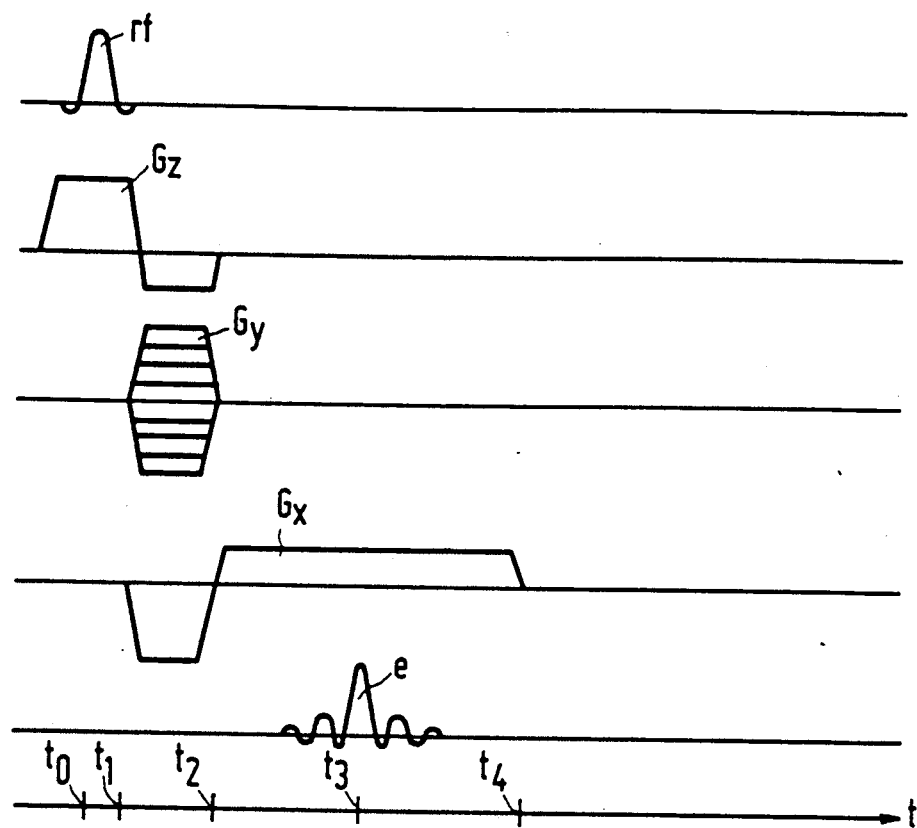
FIG. 2A shows a pulse and gradient sequence.

FIG. 2A shows a pulse and gradient sequence as a function of the time t. The references $t_0$, $t_1$, $t_2$, $t_3$ and $t_4$ denote some instants. The Figure shows an rf magnetic pulse rf which is applied to the object 5 via the transmitter/receiver coil 10, a first, a second and a third magnetic field gradient $G_y$, $G_x$, $G_z$ which are generated by means of the respective gradient magnet coils 14, 13 and 15, and a spin resonance signal e which is received by the transmitter/receiver coil 10. The rf pulse rf is applied to the object 5 at the instant $t_0$. When the object 5 contains protons and the spin resonance distribution is measured as the proton density of the object 5, the oscillator 19 is tuned to a Larmor frequency $\omega_0$ of protons; in this respect, $\omega_0 = \text{gamma}.B_0$, where gamma is the gyroscopic ratio of protons. In a coordinate system rotating at the frequency $\omega_0$, the magnetization M is rotated through an angle which is determined by the rf pulse. The third gradient $G_z$ serves for slice selection. The frequency contents of the pulse rf are such that protons are excited exclusively in a selected slice extending parallel to the xy plane. In the interval $t_1$–$t_2$ the first gradient $G_y$ is applied for phase encoding of the nuclear spins. The first gradient $G_y$ has a variable time integral over different pulse and gradient sequences for obtaining resonance signals; in the version shown, this is achieved by variation of the amplitude of the gradient $G_y$. Furthermore, the second gradient $G_x$ and the third gradient $G_z$ are applied in order to dephase the nuclear spins in the x direction and to rephase the nuclear spins in the z direction. In the interval $t_2$–$t_4$ the second gradient $G_x$ is applied with a polarity which opposes the polarity of $G_x$ in the interval $t_1$–$t_2$, in order to rephase the nuclear spins in the x direction. Around the instant $t_3$ the spin resonance signal e is formed. The A/D converter 18 will sample the spin resonance signal, under the control of the programmed arithmetic means 21, in the interval $t_2$–$t_4$. A two-dimensional Fourier transformation performed on the sampling values 22 produces a spin resonance distribution. A two-dimensional Fourier function of sampling values is to be considered as a mapping in a two-dimensional k space of spatial frequencies. The Fourier function is then a function of the spatial frequencies $k_x$ and $k_y$, corresponding to the x direction and the y direction, respectively. The two-dimensional k space is the Fourier transform of the xy space for the slice z selected by $G_z$. In more general terms pertinent to 3-D acquisition (such as with two phase encoding gradients), a three-dimensional k space is related to the xyz space as a three-dimensional Fourier transform thereof. For a more detailed description of the described pulse and gradient sequence reference is made to said handbook "Practical NMR Imaging", pp. 18-22 and pp. 95-102 for slice selection.

Figure 2B:
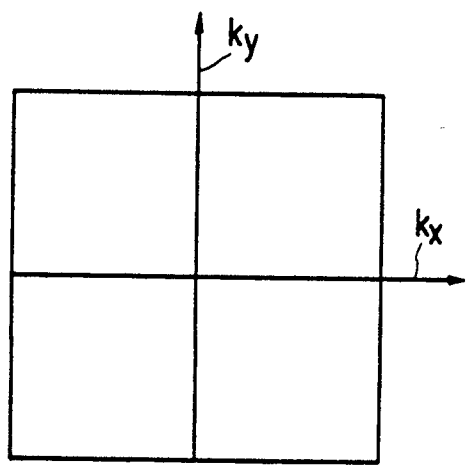
FIG. 2B shows a spatial frequency plane.

FIG. 2B shows a spatial frequency plane. The two dimensional Fourier function of sampling values is a function of the spatial frequencies $k_x$ and $k_y$. $k_x$ and $k_y$ are subject to the relations $k_x$=gamma. $G_x$. dt and $k_y$=-gamma. $G_y$. dt. In the pulse and gradient sequence shown in FIG. 1, for a given value of $G_y$ during the sampling of the spin resonance signal the $k_x k_y$-plane is traversed along a line extending parallel to the $k_x$-axis at a speed gamma. $G_x$.

FIG. 3A shows a profile distribution in accordance with the invention. The Figure shows a distribution of the number $n(k_y)$ of profiles as a function of the spatial frequency $k_y$. The spatial frequency $k_y$ can extend through a range from, for example −128 to +127. In the distribution, being asymmetrical in this case, 1, 2 or 3 profiles have been measured for different $k_y$. The profile distribution is realized during the measurement of the spin resonance signals or can be predetermined. The distribution is realized on the basis of obtaining a maximum information content of the image. As regards mirrored distribution of profiles symmetric in $k_y$ and $k_y$, redundancy exists. When assymetric in $k_y$ and $-k_y$, the non-identical distributions of the numbers of profiles at positive and negative spatial frequencies need not give rise to problems during image reconstruction utilizing so-called "half Fourier" reconstruction. The "half Fourier" reconstruction utilizes the redundancy present. Depending on the profile distribution, reconstruction can be performed with a normal Fourier reconstruction (full reconstruction) or with "half Fourier" reconstruction (partial matrix reconstruction). In this respect the highest number $n(k_y)$ of the profiles which have been selected at least once is of importance, and also the lowest number $n(k_y)$ of the profiles selected. In theory the partial matrix reconstruction must be used if said highest and lowest number do not correspond in an absolute sense. In practice this requirement is less severe; normal Fourier reconstruction can be used when the lowest profile number, in an absolute sense, amounts to some 60% of its maximum possible value in an absolute sense, and also when the difference between the highest and the lowest numbers $n(k_y)$ of the profiles selected is less than approximately 30%. The partial matrix reconstruction is described in the article "Reducing MR imaging time by one-sided reconstruction" by J. Cuppen et al., Topical conference on fast magnetic resonance imaging, Cleveland, Ohio, May 1987.

FIG. 3B shows a redundancy table used for determining the profile distribution in accordance with the invention. According to increasing spatial frequency $k_y$, for example fromm −127 to 128, the table states inter alia a number of times i that the profile at $k_y$ and its opposite at $-k_y$ have been measured, a redundancy value $R(k_y)$ and a function $R_0(k_y)$ of a signal-to-noise ratio associated with the redundancy value $R(k_y)$ or an estimate thereof. For the redundancy value $R(k_y)$ it holds that: $R(k_y)=1/\Delta I(k_y)$, where $\Delta I(k_y)$ is the information increase obtained during the measurement of a profile at $k_y$ or $-k_y$. The redundancy value $R(k_y)$ can be approximated by: $R(k_y)=R_0(k_y)+i$.

In accordance with the invention for a number of profiles $n(k_y)$ to be measured (for positive and negative spatial frequencies) each time the spatial frequency $k_y$ or $-k_y$ is chosen for which $R(k_y)$ is minimum, corresponding to a maximum information increase in the image. When the spatial frequency $k_y$ has been selected, $R(k_y)$ is adapted and the described process is repeated until the number of profiles n to be measured is reached. In order to enable the method in accordance with the invention to be used, an effective procedure must be available for the determination of $R_0(k_y)$. This will be described hereinafter. $R_0(k_y)$ can be approximated by $$R_0(k_y)=1/\{P_p(k_y)/P_N-1\},$$

where $P_p(k_y)$ is the mean signal power in the profile at $k_y$ or $-k_y$. The mean power is to be considered as the sum of the squared sampling values of the signal divided by the number of samples. $P_N$ is the mean noise power (i.e. the variance of the noise) for which it is assumed that it is so-called white Gaussian noise. When the profile distribution is realized during the measurement of the spin resonance signals, a problem is encountered in that $P_p(k_y)$ becomes known only after the profile has been measured at least once. In accordance with the invention $R_0$ is then estimated from a neighbouring profile according to $$\begin{aligned} R_0(k_y) &= R_0(k_y - 1) \text{ for } k_y > 0 \\ &= R_0(-k_y - 1) \text{ for } k_y < 0, \text{ and} \\ &= 0 \text{ for } k_y = 0, \end{aligned}$$

in order to obtain an initial value. This means that measurement of the profile at $k_y$ makes sense only if its neighboring profile at $k_y-1$ has already been measured. When a profile at $k_y$ has been measured, $P_p(k_y)$ can be determined for the profile. $P_N$ is determined by performing a measurement for some time without the pulse rf in a pulse and gradient sequence, i.e. without exciting the spins. Knowledge of $P_N$ and $P_p(k_y)$ enables $R_0(k_y+1)$ to be inserted in the redundancy table, so that the estimate of $R_0$ has already been determined when that spatial frequency is selected. The method in accordance with the invention can be further refined. For instrumental reasons, such as amplifier drift, a number of profiles at central spatial frequencies is measured; for example, $k_y$ extends from $k_y=-4$ to $k_y=3$. The profiles at positive spatial frequencies may also be slightly favoured or monotonicity can be imposed on $R_0(k_y)$ so that the pattern of assignment of profiles does not become very irregular.

FIG. 3C shows a redundancy pattern as a function of the spatial frequency $k_y$. An interrupted line therein indicates $R_0(k_y)$ and a non-interrupted line indicates $R(k_y)$. The situation is shown after a number of profiles has been measured. The redundancy of a profile increases as the number of times that the profile has been measured is larger. The redundancy strongly increases when the signal-to-noise ratio of a profile is very small in case $P_p$ has the same order of magnitude as $P_N$.

In FIG. 4A the spatial frequency plane $k_x k_y$ is related to an additional resonance signal when the values of $R_0(k_y)$ in the redundancy table are predetermined, i.e. before measurement of resonance signals in order to obtain an image. The additional resonance signal is obtained by applying a rf pulse and gradient sequence as described with reference to FIG. 2A, an rf pulse rf being applied to the object during the interval $t_0-t_1$ while at the same time a slice-selective gradient $G_z$ is applied, and may also applying a gradient $G_y$ during the measurement of a resonance signal e in the interval $t_2-t_4$, i.e. $G_y$ takes over the rôle of $G_x$, so that $k_x=0$ in the frequency plane $k_x k_y$ follows a line in the $k_y$ direction at a speed $gamma.G_y$. The additional profile is denoted by ep. From the additional resonance signal and a model function of a signal power distribution $P(k_x,k_y)$ of magnetic resonance data concerning the spatial frequency plane $k_x k_y$ there is estimated $R_0(k_y)$. When all values $R_0(k_y)$ have been inserted in the redundancy table, a profile distribution can be determined, in the same way as described with reference to FIG. 3B, in order to obtain resonance signals for an image. The estimation of $R_0(k_y)$ will be described hereinafter FIG. 4B is a one-dimensional representation of a model function $P(k_x)$ for a signal power distribution, and also shows a spread s in the mean signal power over comparable parts of comparable objects. The model function $P(k_x)$ indicates that over different objects more spread exists for comparatively low $k_x$ values than for comparatively higher $k_x$ values. A model function $P(k_x,k_y)$ for two dimensions will exhibit a similar tendency, i.e. $P(k_x,k_y)$ will decrease isotropically from the origin O of the $k_x k_y$ plane. In the case of 2D acquisition, the model function $P(k_x,k_y)$ can be described as follows:

$$P(k_x,k_y)=C.(1+k_x^2+k_y^2)^{-3/2}.$$

The power $-3/2$ in $P(k_x,k_y)$ can be theoretically derived or empirically determined. Using the additional resonance signal, a constant C is estimated in $P(k_x,k_y)$. The additional resonance signal is sampled so that the distance between two successive sampling values, in terms of spatial frequency, corresponds to a distance d between successive $k_y$ lines in the $k_x k_y$ plane. The additional resonance signal offers an impression of the signal intensity over the $k_x k_y$ plane. C is estimated as follows. For all complex sampling values $d_j$ of the samples j the signal power $p_j=d_j d_j^*$ is determined, where * denotes a conjugated complex operation. The value $j_0$ of j for which $p_j$ is maximum is searched. Over the samples j values $c_j$ are determined according to $c_j=\{mod(-j-j_0)\}^3.(p_j-P_N)$ where mod is a modulus operation and $P_N$ is the mean noise power in each sample j, to be determined by way of a measurement without excitation. C is calculated as the mean value of the values $c_j$ over a largest interval of j values which contains $j_0$ and in which all values of $c_j$ are positive. The values $R_0(k_y)$ are then determined as follows:

$$R_0(k_y)=\{P_N.k_y^2.n/f\}/(2C),$$

where n is the number of samples and f is a factor relating to signal sampling; typically $n=512$ and $f=2$. A profile distribution can be determined by means of the $R_0(k_y)$ found. Because the profile distribution is predetermined, an arbitrary succession can be selected for the measurement of profiles for an image on the basis of the profile distribution. The method can also be combined with profile schemes for reducing motion artefacts in an image of an object which moves during measurement. For example, a profile scheme such as ROPE (Respiratory Ordered Phase Encoding) can be used for reducing motion artefacts due respiration of the object as described on pages 210-213 of said handbook "Practical NMR Imaging". In the case of respiratory artefacts a correction term can also be added to $R_0(k_y)$. The expression given for $R_0(k_y)$ is based on the presence of Gaussian noise; the correction term takes into account respiratory artefacts which are modelled in $R_c$; in that case $R_0=R_0+R_c$. Loss of image quality can occur inter alia because of movement of the object between excitation and the occurrence of the resonance signal, non-saturated tissue moving into the selected object slice. The correction takes into account the "random" y position over any profile. For different circumstances a different $R_c$ can be determined. For example, $$R_c=\exp(4\pi^2 {}^2 k_y^2/FOV^2)-1,$$

where FOV is a y dimension of the measured field (field of view), is a standard deviation of a y position of moving tissue, and exp is the exponential function when the entire object moves more or less to the same extent. When only a fraction f of the object moves, whilst the region of interest does not move, $R_c=f.(1-\exp(-4\pi^2 2k_y^2/FOV^2))$ (for example, for the imaging of the spinal canal). In that case $$R_c=SQRT(1+16\pi^2 M^2 k_y^2/FOV^2)-1,$$

where $M$ is the standard deviation of the y position of the tissue exhibiting the comparatively greatest motion, and SQRT is the square root when a continuous motion distribution exists from regions exhibiting hardly any motion to regions exhibiting strong motion. A signal which is a measure of object motion by respiration can be obtained by means of a respiration sensor. The respiration sensor can be coupled to the processing means 20, the sensor signal then being applied to the programmed arithmetic means 21. A respiration sensor is described for example in U.S. Pat. No. 4,664,129.

FIG. 5 shows an abrupt signal transition s in terms of y values, which transition causes ringing artefacts r in an image. The ringing artefacts r occur if given profiles have not been measured and are caused by the so-called Gibbs phenomenon during Fourier transformation. It is proposed to estimate the non-measured profiles so that the resultant image resembles a likely image without artefacts as much as possible, that is to say an image obtained if the non-measured profiles had been measured. As a result, the image is split as if it were into a "likely" part (the part associated with the artefact-free image) and a "non-likely" part. For non-measured profiles data are estimated which maximize the so-called "likelihood" of the resultant image. For each profile $k_y$ which has not been measured and whose mirror-image profile $-k_y$ has not been measured either, a data matrix of sampling values of resonance signals is multiplied by $i.k_y$ in order to obtain an image, where $i=SQRT(-1)$, after which a Fourier transformation is performed on the data matrix. Subsequently, for each complex pixel value a "likelihood" function $2a.p/(a^2+p.p^*)$ is determined, where a is a constant and p is a pixel gradient between neighbouring pixels. Subsequently, an inverse Fourier transformation is performed on the likelihood function and the result thus obtained is divided by $i.k_y$, which result is used for substituting the non measured profiles. Subsequently, a customary image reconstruction is performed. The procedure followed consists in that high frequency data are estimated from low frequency data, the likelihood of the resultant image being maximized. The likelihood is related to a histogram of image contrasts between successive pixels in the y direction. The histogram can be modelled by a Lorentz function which reflects the occurrence of flat image sections and edge contrasts. Said likelihood function can be optimized for the estimated high spatial frequencies in order to reduce ringing artefacts and the enhance edge contrasts.

Figure 6:
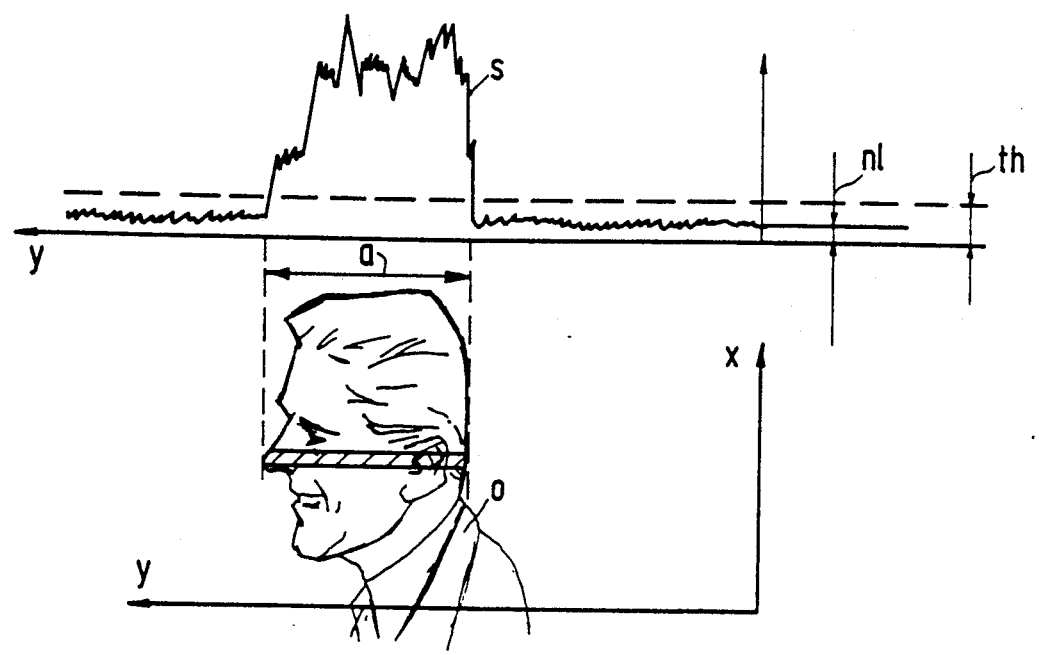
FIG. 6 illustrates the determination of a dimension of an object.

FIG. 6 illustrates the determination of a dimension a in the y direction of an object o in order to enable selection of an oversampling factor on the basis of the dimension a in the y direction (the direction of the phase encoding gradient $G_y$); this will be necessary to avoid backfolding if a selected FOV (field of view) is smaller than the dimension a of the measured object o. This problem is avoided by oversampling, being an increase of the profile density in the $k_y$ direction in the $k_x k_y$ plane. For selective averaging it is attractive to define a comparatively small FOV and to leave it up to the device 1 whether to use the detailing which can thus be realized or not. In that case it is necessary, however, to detect whether the FOV is smaller than the object. It is proposed to measure a profile with $G_y$ as the measuring gradient and with $G_x$ de-activated. After Fourier transformation, the dimension a of the object can be determined from the profile. The Fourier transformed signal s is compared with a threshold value in which is higher than the mean noise level nl, thus defining the dimension of the object in the y direction. The oversampling factor is selected in relation to the FOV. When the profile is applied, however, the amplitude of $G_y$ should be chosen to be sufficiently low in order to enable a large FOV without giving rise to the risk of backfolding.

Figure 7:
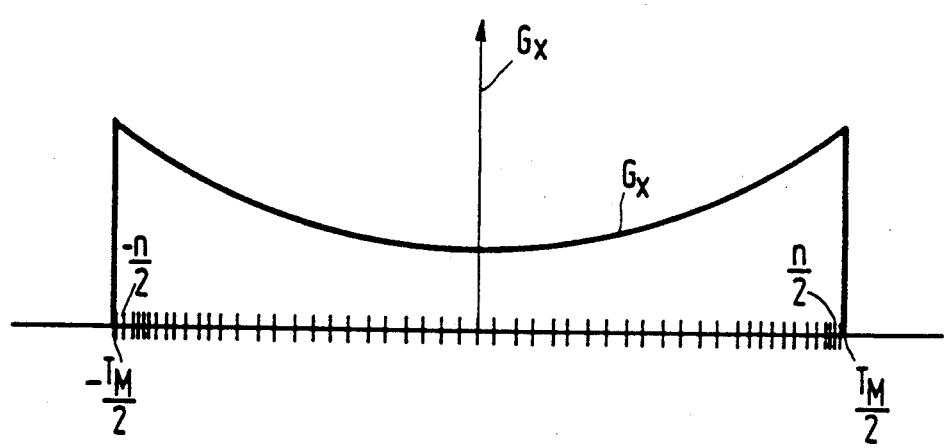
FIG. 7 shows a second magnetic field gradient.

FIG. 7 shows a second magnetic field gradient $G_x$ as a function of the time t, $T_M$ being the available measuring time and n being the number of sampling values of a resonance signal e measured in the measuring period $T_M$. It is proposed to apply a non-constant gradient $G_x$, simultaneously with non-equidistant sampling. The gradient $G_x$ is chosen so that the amplitude of the gradient is higher for large $k_x$ values than for small $k_x$ values ($k_x$=gamma.$G_x$.t). As a result, a larger part of the measuring period $T_M$ is used for the lower spatial frequencies than for the higher spatial frequencies. Noise effects will then be comparatively less significant for lower frequencies. The gradient $G_x$ may be, for example $a^2 + a^2 \tan^2(c.a.t.)$, where a is a constant of the order of magnitude ($n/2^2$ and $c = \{2/(a.T_M)\}.\arctan\{n/2.a\}$. The distribution of the samples j over the measuring period $T_M$ may be, for example $t_j = \{q/(1.a)\}.\arctan(j/a)$, where $t_j$ is the sampling instant with respect to the centre of the sampling interval and $j = -n/2, \ldots n/2$.

Many alternatives are feasible without departing from the scope of the invention. For example, the method described for 2D can be simply extended to 3D. The third field gradient $G_z$ should then also be varied. In the case of the method described with reference to FIG. 3B, a minimum redundancy value $R(k_y, k_z)$ is then determined. In the case of the method described with reference to the FIGS. 4A and 4B, $R_0(k_y,k_z)$ should be estimated on the basis of two additional profiles and a model function $P(k_x, k_y, k_z) = C. (1 + k_x^2 + k_y^2 + k_z^2)^{-2}$. The two additional profiles are measured with $G_y$ and $G_z$, respectively, as the measuring gradient, the other two gradients being deactivated. $R_0(k_y, k_z)$ is then $\{P_N(k_y^2 + k_z^2)^{3/2} .n/f\}/(\pi C/2)$. In order to achieve the monotonicity described with reference to FIG. 3B, the method can be slightly adapted. A neighbouring profile redundancy value $R(k_y + D)$ is estimated as max{R-$(k_y, R_O)$}, where D is a directional indicator +1 or −1 and is a very small positive number, $R\{-(k_y+D)\}$ as $R(k_y+D)+2$. In the latter case the extension to 3D can also be simply achieved. The directional indictator D is usually chosen to be +1 in order to favour positive profiles slightly. It is assumed that the mean power $P_p(k_y)$ equals $P_p(-k_y)$. However, because of lack of homogeneity of the field $B_0$ symmetry may be lacking and it may be that the highest means signal power does not occur for $k_y=0$ but for another profile. The maximum mean power may also occur for a spatial frequency $-k_y$. The side at which the maximum mean power occurs can be detected from the data obtained by measurement of the central profiles. If this maximum mean power occurs for a negative spatial frequency in the y direction, $D = -1$ may be selected. When use is made of a method as described with reference to the FIGS. 4A and 4B, D is determined as the sign of $j_0$. In practice usually profiles will be selected which are situated in a range of lower $k_y$ values around $k_y=0$ amounting to some 70% of the highest $k_y$ value. Usually the higher profiles are then filled with zeroes; however this causes said ringing artifacts in the vicinity of tissue edges. It is proposed to fill the non measured profiles with noise, so that the ringing artifacts are strongly reduced without image details being lost. The noise may be white noise (the noise sampling values are non correlated) and may exhibit a uniform or a Gaussian distribution. The standard deviation of the noise can be determined from a profile without excitation. The profile distribution is aimed at obtaining a maximum amount of information in an image. The signal-to-noise ratio and the resolution are balanced. For practical reasons it may be desirable to emphasize either the signal-to-noise ratio or the resolution. This can be achieved by applying a weighting function to $R_0(k_y)$, so that $R_0'(k_y) = R_0(k_y).w-\{mod(k_y)\}$, where w is a slowly varying function of $k_y$. For example, $w = 1 + (k_y/k_{y,max})^2.a$, where $k_{y,max}$ is the maximum $k_y$ value occurring and a is a constant, for example between 0 and 3. The method can be executed using not only the described gradient echo pulse and gradient sequence, but also using many other described pulse and gradient sequences such as spin echo sequences with 180° pulses and with stimulated echo sequences.

We claim:

1. A method of determining an image representing a spatial distribution of atomic spins in a region of an object located in a uniform magnetic field from acquired atomic spin resonance signals which are excited in said region, wherein electromagnetic radiation pulse and gradient sequences are applied a predetermined number of times in order to obtain the spin resonance signals, each sequence containing at least one electromagnetic radiation pulse for exciting the spins in the uniform magnetic field, a first magnetic field gradient in a first direction with a predetermined value of a time integral over the first magnetic field gradient, within a range of values for phase encoding of the spins, and a second magnetic field gradient in a second direction which is applied during acquisition of the atomic spin resonance signal excited by said sequence, the electromagnetic radiation pulse and gradient sequence being repeated a number of repetitions for each predetermined value of said time integral which number of repetitions is different for different values of said time integral in accordance with a distribution of said number of repetitions for each predetermined value of the time integral, the atomic spin resonance signals being averaged for equal values of the time integral after acquisition of the atomic spin resonance signals and before determination of the spatial distribution, and wherein said distribution of said number of repetitions is determined in a manner to maximize the information content of the image representing the spatial distribution of atomic spins.

2. A method as claimed in claim 1, characterized in that the distribution of said number of repetitions is determined during the acquisition of the spin resonance signals by selecting from a redundancy table containing an adaptable redundancy value for each predetermined value of the time integral each adaptable redundancy value being a function of a signal-to-noise ratio associated with the predetermined value of the time integral, of the number of times that the sequence having the predetermined value of the time integral has been applied, and of the number of times that the sequence having the opposite of the predetermined value of the time integral has been applied, said adaptable redundancy values being adapted during the acquisition of the spin resonance signals.

3. A method as claimed in claim 2, characterized in that the signal-to-noise ratio associated with an adaptable redundancy value for a present predetermined value of the time integral is estimated from a signal-to-noise ratio associated with an adaptable redundancy value for a predetermined value of the time integral neighbouring said present predetermined value.

4. A method as claimed in claim 1, characterized in that prior to acquisition of the spin resonance signals the distribution of said number of repetitions is determined from a predetermined redundancy table with adaptable redundancy values associated with each predetermined value of the time integral by applying in advance of said electromagnetic radiation pulse and gradient sequences a preliminary electromagnetic radiation pulse and gradient sequences in which in each sequence the first magnetic field gradient is applied during the signal acquisition in order to excite an additional resonance signal where from said preliminary sequences there is determined a signal distribution whereby a parameter of a model function of a distribution of a signal power is estimated, and by determining signal-to-noise ratios from a function of a mean noise power, the predetermined values of the time integral and the parameter estimated, after which the distribution of said number of repetitions is determined as a function of the signal-to-noise ratios, the number of times that the value of the time integral has been applied, and of the number of times that an opposite value of the time integral has been applied, said redundancy values being adapted during the determination of the distribution of said number of repetitions.

5. A method as claimed in claim 4, characterized in that during the acquisition of the spin resonance signals a succession of values of the time integral is applied such that effects of motion of the object are reduced.

6. A method as claimed in claim 1, characterized in that all values of the time integral in the sequences which are applied lie within a subrange of the range of values of the time integral.

7. A method as claimed claim 1, characterized in that over the range of values of the time integral there is made an estimate for resonance signals associated with unused values of the time integral not among said predetermined values so that an image is obtained which is a reasonable approximation of an image that would have been obtained by including sequences having said unused values.

8. A method as claimed in claim 1, characterized in that a step size between successive values of the time integral is adapted to a dimension of the object by estimating the dimension of the object from a resonance signal obtained by means of a preliminary pulse and gradient sequence in which the first magnetic field gradient is applied during the acquisition of the resonance signal.

9. A device for determining a spatial distribution of atomic spins in a region of an object located in a measurement space from atomic spin resonance signals, which device comprises means for generating a uniform magnetic field in said measurement space, means for applying electromagnetic radiation pulse and gradient sequences in said measurement space in order to obtain spin resonance signals from said region, each sequence including a phase encoding gradient in which a time integral of said phase encoding gradient has one of a plurality of predetermined values, the electromagnetic radiation pulse and gradient sequence being repeated a number of repetitions for each predetermined value of said time integral which number of repetitions is different for different values of said time integral in accordance with a distribution of said number of repetitions for each predetermined value of the time integral, means for receiving, detecting and sampling the spin resonance signals, and means for displaying an image of the spatial distribution, and also comprises processing means which include programmed arithmetic means for determining the spatial distribution from the sampled spin resonance signals after averaging the atomic spin resonance signals for equal values of the time integral, characterized in that the programmed arithmetic means also comprises means for determining the distribution of the number of sequence repetitions for each value of the time integral of the phase encoding magnetic field gradient in a manner for maximizing the information content of the image.

10. A method as claimed in claim 2, characterized in that all values of the time integral in the sequences which are applied lie within a subrange of the range of values of the time integral.

11. A method as claimed in claim 3, characterized in that all values of the time integral in the sequences which are applied lie within a subrange of the range of values of the time integral.

12. A method as claimed in claim 4, characterized in that all values of the time integral in the sequences which are applied lie within a subrange of the range of values of the time integral.

13. A method as claimed in claim 5, characterized in that all values of the time integral in the sequences which are applied lie within a subrange of the range of values of the time integral.

14. A method as claimed claim 2, characterized in that over the range of values of the time integral there is made an estimate for resonance signals associated with unused values of the time integral not among said predetermined values so that an image is obtained which is a reasonable approximation of an image that would have been obtained by including sequences having said unused values.

15. A method as claimed claim 3, characterized in that over the range of values of the time integral there is made an estimate for resonance signals associated with unused values of the time integral not among said predetermined values so that an image is obtained which is a reasonable approximation of an image that would have been obtained by including sequences having said unused values.

16. A method as claimed claim 13, characterized in that over the range of values of the time integral there is made an estimate for resonance signals associated with unused values of the time integral not among said predetermined values so that an image is obtained which is a reasonable approximation of an image that would have been obtained by including sequences having said unused values.

17. A method as claimed in claim 2, characterized in that a step size between successive values of the time integral is adapted to a dimension of the object by estimating the dimension of the object from a resonance signal obtained by means of a preliminary pulse and gradient sequence in which the first magnetic field gradient is applied during the acquisition of the resonance signal.

18. A method as claimed in claim 3, characterized in that a step size between successive values of the time integral is adapted to a dimension of the object by estimating the dimension of the object from a resonance signal obtained by means of a preliminary pulse and gradient sequence in which the first magnetic field gradient is applied during the acquisition of the resonance signal.

19. A method as claimed in claim 16, characterized in that a step size between successive values of the time integral is adapted to a dimension of the object by estimating the dimension of the object from a resonance signal obtained by means of a preliminary pulse and gradient sequence in which the first magnetic field gradient is applied during the acquisition of the resonance signal.

* * * * *